United States Patent
Xie et al.

(10) Patent No.: US 9,333,601 B2
(45) Date of Patent: May 10, 2016

(54) STORAGE MECHANISM AND FEEDING DEVICE USING THE SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Hai-Fang Xie, Shenzhen (CN); Ying-Ying Dai, Shenzhen (CN); Zhao-Qian Zhang, Shenzhen (CN); Ying-Jun Peng, Shenzhen (CN); Wen-Jie Lang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 133 days.

(21) Appl. No.: 14/323,138

(22) Filed: Jul. 3, 2014

(65) Prior Publication Data

US 2015/0010378 A1    Jan. 8, 2015

(30) Foreign Application Priority Data

Jul. 5, 2013 (CN) .................. 2013 1 02810070

(51) Int. Cl.
| | |
|---|---|
| G11B 17/056 | (2006.01) |
| B23P 19/00 | (2006.01) |
| A47B 88/04 | (2006.01) |
| B25J 9/14 | (2006.01) |
| B65B 35/28 | (2006.01) |
| H05K 13/02 | (2006.01) |
| H05K 13/04 | (2006.01) |

(52) U.S. Cl.
CPC ............... *B23P 19/004* (2013.01); *A47B 88/04* (2013.01); *B25J 9/144* (2013.01); *B65B 35/28* (2013.01); *G11B 17/056* (2013.01); *H05K 13/021* (2013.01); *H05K 13/0434* (2013.01)

(58) Field of Classification Search
CPC ....... G11B 17/056; A47B 88/04; B25J 9/144; B65B 35/28
See application file for complete search history.

(56) References Cited

U.S. PATENT DOCUMENTS

| | | | | |
|---|---|---|---|---|
| 6,227,708 | B1 * | 5/2001 | Rixen ..................... | B23Q 1/017 384/45 |
| 2014/0262979 | A1 * | 9/2014 | Bonora ..................... | B07C 5/00 414/590 |
| 2015/0123685 | A1 * | 5/2015 | Thurmaier .......... | G01R 31/2889 324/750.25 |

FOREIGN PATENT DOCUMENTS

| | | |
|---|---|---|
| CN | 2301776 Y | 12/1998 |
| CN | 2614542 Y | 5/2004 |
| CN | 2759944 Y | 2/2006 |
| CN | 101022026 A | 8/2007 |
| CN | 201702528 U | 1/2011 |

* cited by examiner

*Primary Examiner* — Gerald McClain
(74) *Attorney, Agent, or Firm* — Novak Druce Connolly Bove + Quigg LLP

(57) ABSTRACT

A feeding device includes a storage mechanism and an adsorbing mechanism. The storage mechanism includes two side plates substantially parallel to each other, two support members slidably coupled between the two side plates, two driving members, and two feeding trays. The driving members are mounted to one of the two side plates and coupled to the corresponding support members. The driving members are configured to drive the two support members to move out of the storage mechanism one at a time. The feeding trays are configured for receiving workpieces and coupled to the corresponding support members.

15 Claims, 3 Drawing Sheets

STORAGE MECHANISM AND FEEDING DEVICE USING THE SAME

FIELD

The subject matter herein generally relates to storage mechanisms, and particular to a storage mechanism in an automatic production and a feeding device.

BACKGROUND

A feeding device can be used to move workpieces to a determined position for assembling or machining. For example, when electronic devices are assembled, a transfer mechanism of a feeding device can couple to elements of the electronic devices. Feed trays can be manually delivered to the adsorbing mechanism.

BRIEF DESCRIPTION OF THE DRAWINGS

Implementations of the present technology will now be described, by way of example only, with reference to the attached figures.

DETAILED DESCRIPTION

Figure 1:
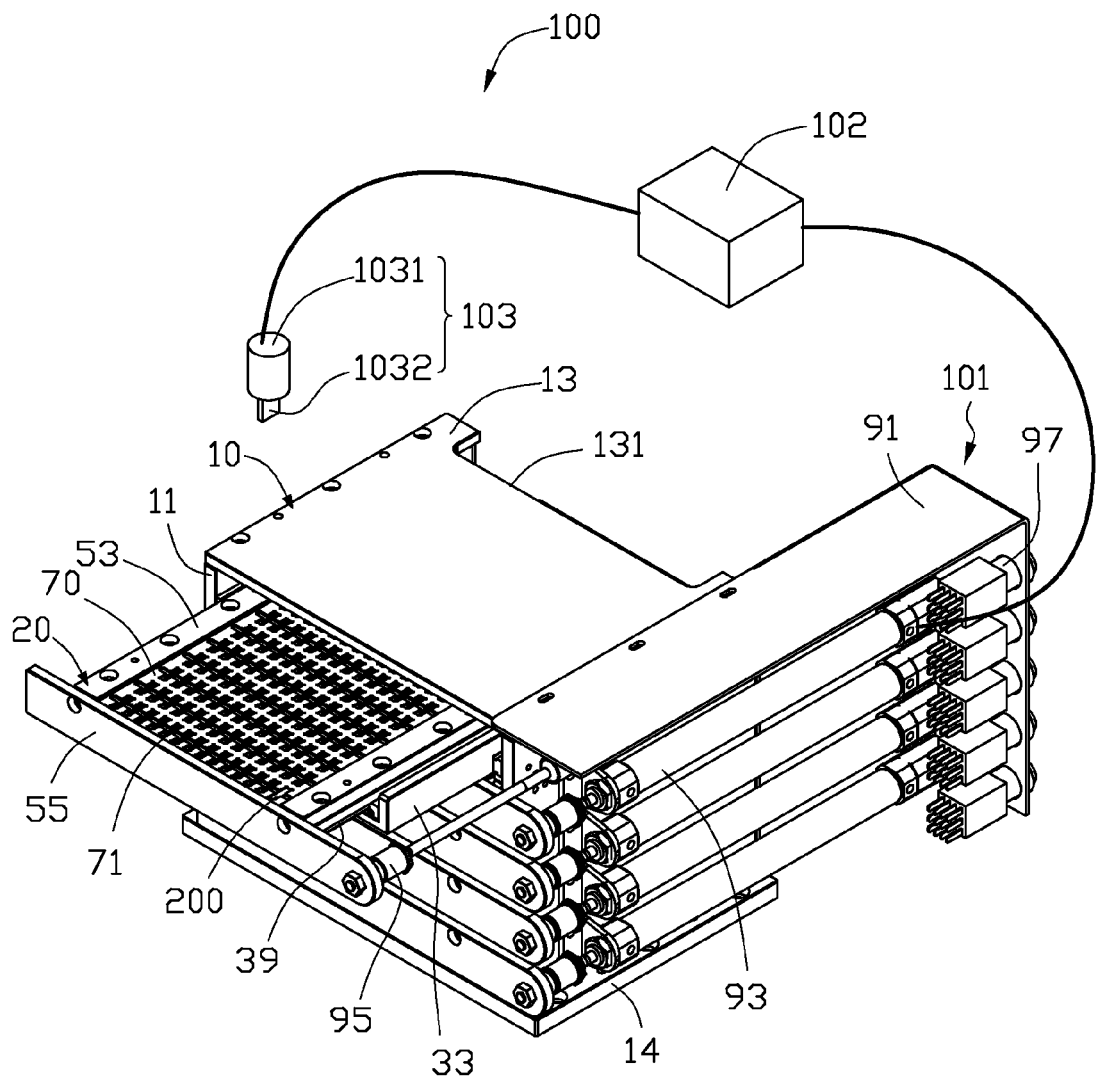
FIG. 1 is an isometric view of an embodiment of a feeding device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is in relation to a feeding device that includes a storage mechanism and an adsorbing mechanism located above the storage mechanism. The storage mechanism includes two side plates substantially parallel to each other, at least two support members slidably coupled between the two side plates, at least two driving members, and at least two feeding trays. The at least two driving members are mounted to one of the two side plates and respectively coupled to the at least two support members. The at least two driving members are configured to respectively telescope the at least two support members at predetermined intervals. The at least two feeding trays are configured for receiving workpieces and respectively coupled to the support members.

FIG. 1 illustrates an embodiment of a feeding device 100. In the illustrated embodiment, the feeding device 100 can be configured to adsorb workpieces 200 to an electronic device (not shown) for assembling. The workpieces 200 can be tags, foams, conductive metal foils, or the like.

Figure 2:
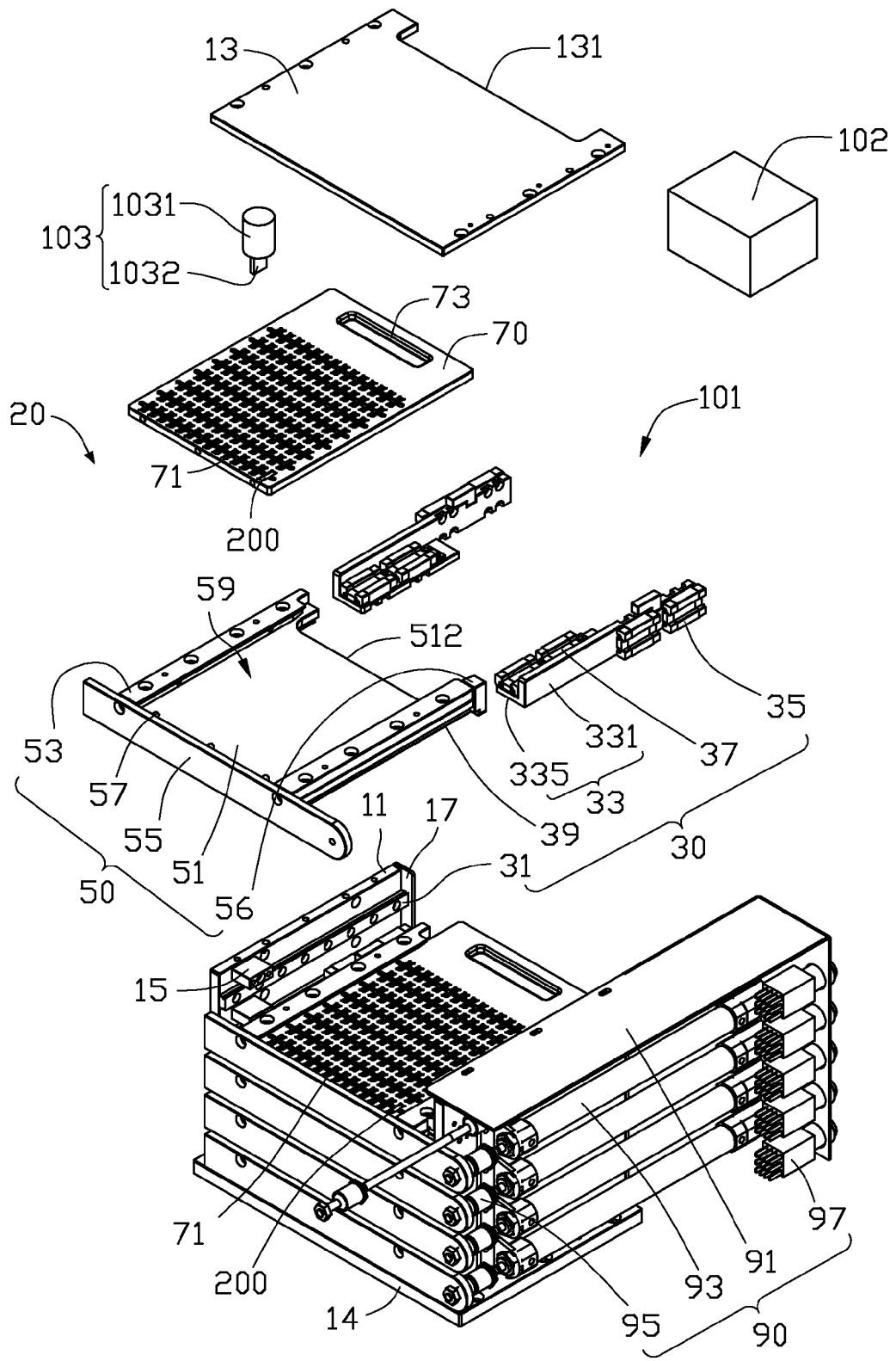
FIG. 2 is an exploded, isometric view of the feeding device in FIG. 1.

FIGS. 1 and 2 illustrate that the feeding device 100 can include a storage mechanism 101, a controller 102, and an adsorbing mechanism 103. The storage mechanism 101 can include a storage frame 10, a plurality of feeding mechanisms 20, and a driving assembly 90. In at least one embodiment, each feeding mechanism 20 can include two guiding assemblies 30, a feeding frame 50, and a feeding tray 70. Each feeding frame 50 can be mounted to the corresponding two guiding assemblies 30. Each feeding frame 50 can be slidably received in the storage frame 10 via the corresponding two guiding assemblies 30. Each feeding tray 70 can be slidably coupled to the corresponding feeding frame 50. The driving assembly 90 can be located at a side of the storage frame 10 and configured to move the feeding frames 50 of the plurality of feeding mechanisms 20 one-by-one. In at least one embodiment, the storage mechanism 101 can include five feeding mechanisms 20.

The storage frame 10 can be a substantially hollow frame and include two side plates 11, a top plate 13, a bottom plate 14, a plurality of limiting members 15, and two blocking members 17. In at least one embodiment, there are five pairs of limiting members 15. Each limiting member 15 is coupled to an inner side of the corresponding sidewall 11, and each pair of limiting members 15 is configured to limit a movement of the corresponding feeding mechanism 20. The side plates 11, the top plate 13, and the bottom plate 14 can each be substantially rectangular plates. The side plates 11 can be substantially parallel to each other and coupled to the top plate 13. The side plates 11 can be substantially perpendicular to the top plate 13. The top plate 13 can be substantially parallel to the bottom plate 14. The side plates 11, the top plate 13, and the bottom plate 14 can cooperatively define a receiving chamber 19. Each blocking member 17 can protrude from a side edge of the corresponding side plate 11 into the receiving chamber 19 and be substantially perpendicular to the side plate 11. A side edge of the top plate 13 can define an operation cutout 131.

The two guiding assemblies 30 of each feeding mechanism 20 can be coupled to inner sides of the corresponding side plates 11. The guiding assemblies 30 can be substantially parallel to each other. Each guiding assembly 30 can include a first guiding rail 31, a bearing member 33, two first guiding members 35, two second guiding members 37, and a second guiding rail 39. The first guiding rail 31 can be a substantially rectangular bar. Each first guiding rail 31 can be coupled to the corresponding side plate 11 and located between two corresponding limiting members 15. Each first guiding rail 31 can be substantially perpendicular to the corresponding blocking member 17. The first guiding rails 31 of the guiding assemblies 30 can be substantially parallel to each other.

The bearing member 33 can be substantially L-shaped and include a first support portion 331, and a second support portion 335 extending from the first support portion 331. The second support portion 335 can be substantially perpendicular to the first support portion 331. The first guiding members 35 can be coupled to the first support portion 331. The first guiding members 35 of each guiding assembly 30 can be slidably coupled to the corresponding first guiding rails 31, to enable the bearing members 33 to slide along the corresponding first guiding rails 31. The limiting members 15 limit movement of the first guiding members 35 along the first guiding rails 31. The second guiding members 37 can be coupled to the second support portion 335. The second guiding rail 39 can be slidably coupled to the second guiding member 37. Thus, the second guiding rails 39 can slide along the corresponding bearing members 33 via the corresponding second guiding members 37.

The feeding frame 50 can be coupled to the corresponding second guiding rails 39. The feeding frame 50 can include a support member 51, two guiding rods 53, a coupling member 55, a blocking member 56, and a plurality of magnetic members 57. The support member 51 can be a substantially rectangular plate. The support members 51 of the feeding frames 50 can be substantially parallel to each other. Each support member 51 can be coupled between two corresponding guiding rods 53. Each guiding rod 53 can be coupled to a corresponding second guiding rail 39. Thus, the feeding frame 50 can slide along the corresponding bearing members 33 via the second guiding rails 39 and the second guiding members 37. The support member 51 can define a recess 512 that can align to the operation cutout 131 of the top plate 13, thereby allowing the corresponding feeding tray 70 to be easily pulled. Each guiding rod 53 and the corresponding second guiding rail 39 can be coupled to opposite sides of the support member 51. The coupling member 55 can be fixed to an end portion of the support member 51 away from the recess 512. The coupling member 55 can be substantially perpendicular to the guiding rods 53. A length of the coupling members 55 can be longer than a distance between the two side plates 11.

The support member 51, the guiding rods 53, and the coupling member 55 can cooperatively define a receiving portion 59 for receiving the feeding tray 70. The blocking member 56 can be mounted to an end portion of one of the guiding rods 53 adjacent to the recess 512, and extend toward the corresponding second support portion 335. The support member 51 can slide along the corresponding bearing members 33 until the blocking member 56 resists against the corresponding second guiding members 37. The magnetic members 57 can be mounted on a side of the coupling member 55 facing the receiving portion 59. In at least one embodiment, the magnetic members 57 can be magnets. The feeding tray 70 can be made of magnetic conductive materials. Thus, the magnetic member 57 can adhere to the feeding tray 70 to prevent the feeding tray 70 from shaking while the feeding frame 50 is moved.

Each feeding tray 70 can slide into the corresponding receiving portion 59 along the corresponding guiding rods 53 and be magnetically adhered to the magnetic members 57. Each feeding tray 70 can define a plurality of positioning grooves 71 for positioning the workpieces 200. Each feeding tray 70 can include a handle 73 that can align to the corresponding recess 512 and the operation cutout 131. An operator can grasp the handle 73 to pull the feeding tray 70 from the receiving portion 59 to place workpieces 200 on the feeding tray 70.

Figure 3:
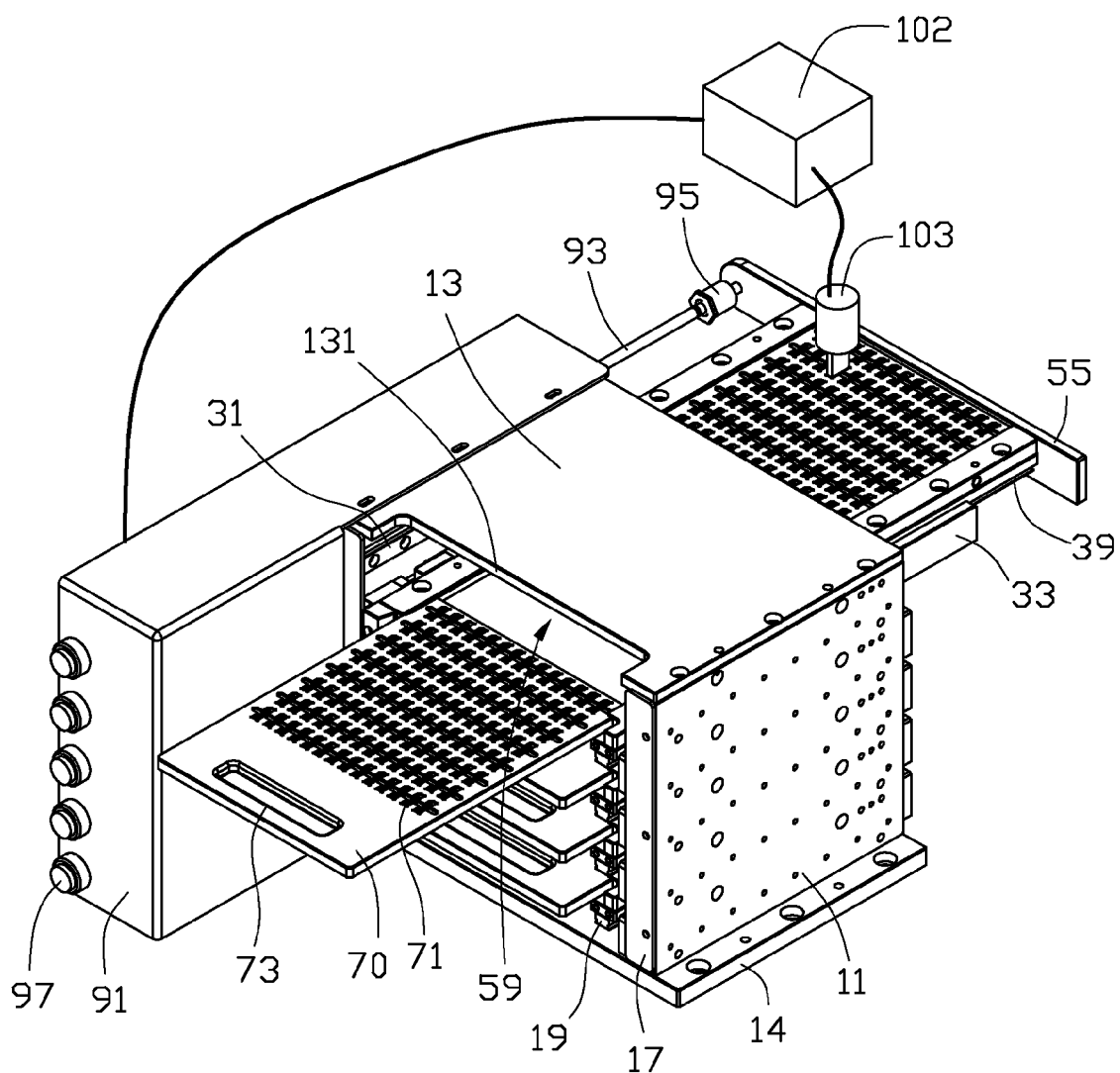
FIG. 3 is an isometric view of the feeding device in FIG. 1 for a different angle.

FIGS. 2 and 3 illustrate that the driving assembly 90 can be mounted to one of the side plates 11 and positioned outside of the storage frame 10. The driving assembly 90 can include a protective cover 91, a plurality of driving members 93, a plurality of floating joints 95, and a plurality of control buttons 97. In at least one embodiment, the driving assembly 90 can include five driving members 93, five floating joints 95, and five control buttons 97. Each driving member 93 can be coupled to one corresponding floating joint 95 and one corresponding control button 97, and each floating joint 95 can be coupled to one corresponding coupling member 55. The protective cover 91 can be mounted to the corresponding side plate 11 and define a receiving space (not labeled) therein. The driving members 93 can be received in the receiving space of the protective cover 91 and be electrically coupled to the controller 102. Each driving member 93 can be coupled to the corresponding coupling member 55 via the corresponding floating joint 95 to prevent abrasion between the driving member 93 and the coupling member 55. In at least one embodiment, the driving members 93 can be telescopic cylinders and can drive the corresponding feeding frames 50 to slide out of the receiving chamber 19.

The controller 102 can control the driving members 95 to drive the feeding frames 50 to slide out of the receiving chamber 19. The support members 51 can move with the corresponding bearing members 33 along the corresponding first guiding rails 31, until the corresponding first guiding members 35 resist against the corresponding limiting members 15. When the first guiding members 35 resist against the corresponding limiting members 15, the support member 51 can continue to move relative to the bearing member 33 via the corresponding second guiding members 37, until the blocking member 56 resists against the corresponding second guiding members 37. When the blocking member 56 resists against the second guiding members 37, the workpieces 200 on the corresponding feeding tray 70 are positioned outside of the storage frame 10 and below the adsorbing mechanism 103. The control buttons 97 can be mounted to an outer side of the protective cover 91 (shown in FIG. 3) and be electrically coupled to the corresponding driving members 93. When the feeding trays 70 with workpieces 200 are received in the corresponding receiving portions 59, the corresponding control buttons 97 can be pressed, causing the controller 102 to control the corresponding driving members 93 to move the corresponding feeding frames 50 one-by-one at predetermined intervals.

The adsorbing mechanism 103 can include a moving shaft 1031, and an adsorbing member 1032 mounted to the moving shaft 1031. The moving shaft 1031 can be electrically coupled to the controller 102. The controller 102 can control the moving shaft 1031 to move the adsorbing member 1032 to the workpieces 200. Thus, the adsorbing member 1032 can adsorb to the workpieces 200 to move the workpieces 200 to a next process.

In use, the controller 102 can control the driving members 93 to push the corresponding coupling members 55 one-by-one at predetermined intervals, thereby driving the corresponding feeding trays 50 to slide out of the receiving chamber 19. When one of the support members 51 is driven by the corresponding driving member 93, the support member 51 and the corresponding bearing members 33 can slide along the corresponding first guiding rails 31, until the first guiding rails 31 resist against the corresponding limiting members 15. The support member 51 can continue to slide along the corresponding second guiding members 37, until the corresponding blocking member 56 resists against the second guiding members 37. When the corresponding feeding tray 70 is positioned outside of the storage frame 10, the controller 102 can control the moving shaft 1031 to move the adsorbing member 1032 to the workpieces 200. The adsorbing member 1032 can adsorb to the workpieces 200 to move the workpieces 200 to a next process. When all of the workpieces 200 of one of the feeding trays 70 are removed, the controller 102 can control the corresponding driving member 93 to pull back the corresponding feeding mechanism 20 until the corresponding support member 51 is received in the receiving chamber 19. Then, the support member 51 of a next feeding mechanism 20 can be driven to move outside of the storage frame 10 to supply the workpieces 200. The empty feeding tray 70 can be pulled out from the receiving portion 59 to place more workpieces 200 by grasping the handle 73.

In at least one embodiment, the control buttons 97 and the controller 102 can be omitted, as long as the driving members 93 can be preset to drive the corresponding feeding mechanisms 20 at predetermined time intervals. The top plate 13 can be omitted, such that a top-most feeding tray 70 is exposed to the outside. The driving members 93 can be directly mounted to the corresponding side plate 11 and directly coupled to the corresponding coupling members 55.

The embodiments shown and described above are only examples. Many details are often found in the art such as the other features of a feeding device. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A storage mechanism comprising:
two side plates substantially parallel to each other;
at least two support members slidably coupled between the two side plates;
at least two driving members mounted to one of the two side plates and coupled to the corresponding support members, the at least two driving members configured to drive the at least two support members to slide out of the storage mechanism at predetermined intervals;
at least two feeding trays configured to receive workpieces and each respectively coupled to the corresponding support members, and
at least two guiding assemblies, wherein each guiding assembly comprises a first guiding rail, a first guiding member, a bearing member, a second guiding member, and a second guiding rail, the first guiding member is located on the bearing member and is slidably coupled to the first guiding rail, the first guiding member is oriented on a first plane which is parallel to an extending plane of one of the at least two feeding trays, the first guiding member is coupled to one of the at least two support members, the first guiding rails of the at least two guiding assemblies are parallel to each other and respectively coupled to the two side plates, the first guiding rails of the at least two guiding assemblies are respectively coupled to the two side plates, one of the at least two support members is configured to be slidably coupled to the side plates via the at least two guiding assemblies, the bearing member comprises a first support portion and a second support portion substantially perpendicularly extending from the first support portion, the first guiding member is coupled to the first support portion, the second guiding member is located on the bearing member and is coupled to the second support portion, the second guiding member is oriented on a second plane, the second plane is substantially perpendicular to the first plane, and the second guiding rail is mounted on the corresponding support member and slidably coupled to the second guiding member.

2. The storage mechanism of claim 1, further comprising at least two groups of guiding rods, wherein each group of guiding rod comprises two guiding rods coupled to opposite sides of the corresponding support member, each feeding tray is configured to slide along the corresponding two guiding rods to the corresponding support member and positioned between the two guiding rods.

3. The storage mechanism of claim 1, wherein the at least two driving members are received in a protective cover, the protective cover is coupled to one of the two side plates.

4. The storage mechanism of claim 1, further comprising at least two blocking members, wherein the at least two blocking members are respectively coupled to the at least two support members and partially protrude out from the corresponding support members, the at least two blocking member are configured to block the second guiding members of the at least two guiding assemblies.

5. The storage mechanism of claim 1, further comprising a plurality of limiting members respectively mounted to the two side plate, wherein the limiting members are configured to resist against the corresponding first guiding members to stop the corresponding support member.

6. The storage mechanism of claim 1, further comprising at least two coupling members respectively coupled to the at least two support members, wherein a length of the at least two coupling members is larger than a distance of the two side plates.

7. The storage mechanism of claim 6, wherein the at least two driving members are respectively coupled to the at least two coupling members via a floating joint.

8. The storage mechanism of claim 6, further comprising at least two magnetic members respectively coupled to the at least two coupling members, wherein the at least two magnetic members are located at a side of the corresponding coupling member adjacent to the corresponding support member.

9. The storage mechanism of claim 8 further comprising a top plate, wherein the top plate defines an operation cutout corresponding to the handle, each support member define a recess corresponding to the operation cutout of the top plate.

10. The storage mechanism of claim 6, wherein each feeding tray define a handle at a side away from the corresponding coupling member.

11. A feeding device comprising:
a storage mechanism comprising:
two side plates substantially parallel to each other;
at least two support members slidably coupled between the two side plates;
at least two driving members mounted to one of the two side plates and coupled to the corresponding support members, the at least two driving members configured to drive the at least two support members to slide out of the storage mechanism at predetermined intervals;
at least two feeding trays configured to receive workpieces and respectively coupled to the corresponding support members;
an adsorbing mechanism located above the storage mechanism, and
at least two guiding assemblies, wherein each guiding assembly comprises a first guiding rail, a first guiding member, a bearing member, a second guiding member, and a second guiding rail, the first guiding member is located on the bearing member and is slidably coupled to the first guiding rail, the first guiding member is oriented on a first plane which is parallel to an extending plane of one of the at least two feeding trays, the first guiding member is coupled to one of the at least two support members, the first guiding rails of the at least two guiding assemblies are parallel to each other and respectively coupled to the two side plates, the first guiding rails of the at least two guiding assemblies are respectively coupled to the two side plates, one of the at least two support members is configured to be slidably coupled to the side plates via the at least two guiding assemblies, the bearing member comprises a first support portion and a second support portion substantially perpendicularly extending from the first support portion, the first guiding member is coupled to the first support portion, the second guiding member is located on the bearing member and is coupled to the second support portion, the second guiding member is oriented on a second plane, the second plane is substantially perpendicular to the first plane, and the second guiding rail is mounted on the corresponding support member and slidably coupled to the second guiding member.

12. The feeding device of claim 11, wherein the storage mechanism further comprises at least two blocking members, the at least two blocking members are respectively coupled to the at least two support members and partially protrude out from the corresponding support members, the at least two blocking member are configured to block the second guiding members of the at least two guiding assemblies.

13. The feeding device of claim 11, wherein the storage mechanism further comprises a plurality of limiting members respectively mounted to the two side plate, the limiting members are configured to resist against the corresponding first guiding members to stop the corresponding support member.

14. The feeding device of claim 11, wherein the adsorbing mechanism comprises a moving shaft and an adsorbing member mounted on the moving shaft.

15. The feeding device of claim 11, further comprising a controller, wherein the controller is electrically coupled to the at least two driving members and the adsorbing mechanism.

* * * * *